United States Patent
Hinsberg et al.

(10) Patent No.: US 8,298,751 B2
(45) Date of Patent: Oct. 30, 2012

(54) ALKALINE RINSE AGENTS FOR USE IN LITHOGRAPHIC PATTERNING

(75) Inventors: William D. Hinsberg, San Jose, CA (US); Gregory Michael Wallraff, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 12/611,043

(22) Filed: Nov. 2, 2009

(65) Prior Publication Data

US 2011/0104900 A1 May 5, 2011

(51) Int. Cl.
*G03F 7/26* (2006.01)

(52) U.S. Cl. ..................................................... 430/313

(58) Field of Classification Search .................. 430/311, 430/331, 329, 313; 438/694
See application file for complete search history.

(56) References Cited

U.S. PATENT DOCUMENTS

| | | | |
|---|---|---|---|
| 5,175,124 A | 12/1992 | Winebarger | |
| 5,466,389 A * | 11/1995 | Ilardi et al. | 510/175 |
| 6,506,684 B1 | 1/2003 | Daniel et al. | |
| 6,585,825 B1 | 7/2003 | Skee | |
| 7,365,045 B2 * | 4/2008 | Walker et al. | 510/178 |
| 2007/0152252 A1 * | 7/2007 | Buehler et al. | 257/295 |
| 2010/0093176 A1 * | 4/2010 | Chang | 438/694 |

FOREIGN PATENT DOCUMENTS

| WO | WO03006597 A1 | 1/2003 |
|---|---|---|
| WO | WO03006598 A1 | 1/2003 |

OTHER PUBLICATIONS

Robert Chau et al., "Application of high-k gate dielectrics and metal gate electrodes to enable silicon and non-silicon logic nanotechnology", Microelectronic Engineering 2005, vol. 80, pp. 1-6.
J. Huang et al., "Device and Reliability Improvement of HfSiON+LaOx/Metal Gate Stacks for 22nm Node Application", IEEE Xplore, Electron Devices Meeting, 2008, INSPEC Accession No. 10479638, Digital Object Identifier: 10.1109/IEDM.2008. 4796609, Current Version Published:Feb. 27, 2009, pp. 1-4.
Satoshi Kamiyama et al., "Systematic Study of Vth Controllability Using ALD-Y2O3, La2O3, and MgO2 Layers with HfSiON/Metal Gate First n-MOSFETs for hp 32 nm Bulk Devices", IEEE Xplore, Electron Devices Meeting 2008, INSPEC Accession No. 10479637, Digital Object Identifier: 10.1109/IEDM.2008.4796608, Current Version Published:Feb. 27, 2009, pp. 1-4.
W. Hinsberg et al., "Characterization of Reactive Dissolution and Swelling of Polymer Films Using a Quartz Crystal Microbalance and Visible and Infrared Reflectance Spectroscopy", American Chemistry Society 2005, vol. 38, pp. 1882-1898.

* cited by examiner

*Primary Examiner* — Brittany Raymond
(74) *Attorney, Agent, or Firm* — Daniel E. Johnson

(57) ABSTRACT

Lithographic patterning methods involve the formation of a (one or more) metal oxide capping layer, which is rinsed with an aqueous alkaline solution as part of the method. The rinse solution does not damage the capping layer, but rather allows for lithographic processing without thinning the capping layer or introducing defects into it. Ammoniated water is a preferred rinse solution, which advantageously leaves behind no nonvolatile residue.

27 Claims, 6 Drawing Sheets

ALKALINE RINSE AGENTS FOR USE IN LITHOGRAPHIC PATTERNING

TECHNICAL FIELD

The invention relates to methods that involve the use of alkaline solutions for rinsing certain layers that are formed during lithographic patterning. More particularly, the invention relates to using alkaline solutions for rinsing metal oxide layers formed during lithographic processing, e.g., during the fabrication of high κ (dielectric constant) and metal gate materials.

BACKGROUND

Increasingly exotic inorganic materials are being used in advanced semiconductor devices, even as the integration of these materials into the device fabrication process has proven to be challenging. By way of example, high-κ and metal gate (HKMG) materials have been used to further improve the performance of semiconductor devices (see, for example, "Application of High-κ Gate Dielectrics and Metal Gate Electrodes to enable Silicon and Non-Silicon Logic Nanotechnology", R. Chau et. al, Microelectronic Engineering, vol. 80, pp. 1-6, 2005). In HKMG devices, a hafnium or zirconium-based compound serves as the gate dielectric, and one or more inorganic oxides (e.g., yttrium oxide ($Y_2O_3$), lanthanum oxide ($La_2O_3$), and magnesium oxide (MgO)) are used as thin base and capping layers (see, for example, "Systematic Study of $V_{th}$ Controllability Using ALD-$Y_2O_3$, $La_2O_3$, and MgO Layers with HfSiON/Metal Gate First n-MOSFETs for hp 32 nm Bulk Devices," S. Kamiyama et al., IEDM 2008 Proceedings, IEEE). Because the electrical properties of the HKMG layer can depend on the thickness of the capping layers, precise process control is required to make useful devices (see, for example, "Device and Reliability Improvement of HfSiON+$LaO_x$/Metal Gate Stacks for 22 nm Node Application", J. Huang et al., IEDM 2008 Proceedings, IEEE).

In one example of a HKMG process flow, the capping oxide layer is applied and then patterned by conventional photolithographic processing. Wet etching with an acidic solution may be used to remove the capping layer from selected areas of the substrate. During this process flow, the capping layer is contacted by the process chemicals used to perform the lithographic patterning prior to the last wet etch step. These process chemicals typically include an aqueous developer solution of tetramethyl ammonium hydroxide (TMAH) and water, which is used to rinse all traces of the developer solution from the substrate. Commonly, the rinse water is pretreated with carbon dioxide to increase its conductivity, thereby dissipating charge that might otherwise result in electrostatic damage to the semiconductor devices (see, for example, U.S. Pat. No. 5,175,124 to Winebarger, 1992).

SUMMARY

Simple and effective methods are disclosed for rinsing a metal oxide capping layer of the residue (e.g., processing chemicals) that can arise during lithographic processing, without damaging the capping layer or introducing defects into it.

A preferred aspect of the invention is a method of treating a metal oxide film of a metal gate device. The method includes, following at least one process step to form the film, rinsing at least a portion of the film with alkaline water (having a basic compound therein) to remove residue, while dissolving a limited amount of said portion of the film. In particular, the average thickness of said portion of the film is reduced by less than 1 angstrom, or alternatively, less than 50% of the mass of said portion of the film is dissolved away. Following the rinsing step, i) any residue of the basic compound is allowed to evaporate, and ii) said portion of the film is not rinsed in a non-alkaline aqueous solution. The metal oxide includes an oxide selected from the group consisting of magnesium, barium, scandium, cerium, samarium, erbium, terbium, neodymium, lanthanum, and gallium oxides.

Another preferred aspect of the invention is a method that includes:

(a) forming at least one semiconducting region that resides over a substrate;
(b) forming a dielectric region on said at least one semiconducting region;
(c) forming an inorganic capping layer on the dielectric region;
(d) applying a photoresist layer over the capping layer;
(e) exposing a portion of the photoresist layer to radiation to form an exposed photoresist layer;
(f) optionally applying a post-exposure bake to the exposed photoresist layer;
(g) developing the exposed photoresist layer to remove a portion of it, thereby revealing a first portion of the capping layer;
(h) rinsing the developed photoresist layer and the first portion of the capping layer with alkaline water (having a basic compound therein) to remove any residue, while dissolving a limited amount of the first portion of the capping layer such that the average thickness of the first portion of the capping layer is reduced by less than 1 angstrom;
(i) etching away the first portion of the capping layer;
(j) applying a strip etch to remove remaining photoresist, thereby revealing a second portion of the capping layer that had been in contact with photoresist; and
(k) rinsing the second portion of the capping layer with alkaline water (having a basic compound therein) to remove any residue, while dissolving a limited amount of the second portion of the capping layer such that the average thickness of the second portion of the capping layer is reduced by less than 1 angstrom;
and wherein following the rinsing step:
(l) any residue of the basic compound is allowed to evaporate, and
(m) the second portion of the capping layer is not rinsed in a non-alkaline aqueous solution.

The method may be repeated to form various semiconducting elements that are in electrical communication with each other, thereby forming a semiconducting device. In one preferred implementation of the method, prior to step (d), a developed portion of a photoresist layer is stripped if this developed portion is misaligned with the semiconducting region.

BRIEF DESCRIPTION OF THE DRAWINGS

FIG. 1, which includes

FIG. 3, which includes

DETAILED DESCRIPTION

One preferred aspect of the invention is described with respect to FIG. 1. FIG. 1A shows a substrate 110, a semiconducting region 114, and a high κ dielectric layer 118 (e.g., a layer having a dielectric constant greater than that of amorphous $SiO_2$, or greater than about 3.9). The substrate 110 may be made of silicon, GaAs, or another suitable substrate material. The semiconducting region 114 resides over the substrate 110 and may be formed by etching away a portion of the substrate, followed by building up the region 114 using lithographic techniques. Alternatively, the semiconducting region 114 may be formed by bombarding a substrate material with ions, thereby altering the physical properties of the bombarded region as ions are implanted in it. Depending upon the end product desired, the semiconducting region 114 may actually include a number of different layers or regions. The high κ dielectric layer 118 may be hafnium oxide, for example, which may be deposited over substrate 110/semiconducting region 114 through vacuum deposition.

Figure 1A:
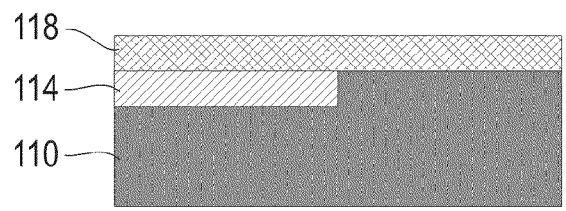
FIGS. 1A, 1B, 1C, 1D, 1E, 1F, and 1G, illustrates a lithographic method of the present invention, in which a metal oxide capping layer is rinsed with an aqueous alkaline solution, thereby removing residue (e.g., processing chemicals) without significantly thinning or damaging the capping layer.
Figure 1B:
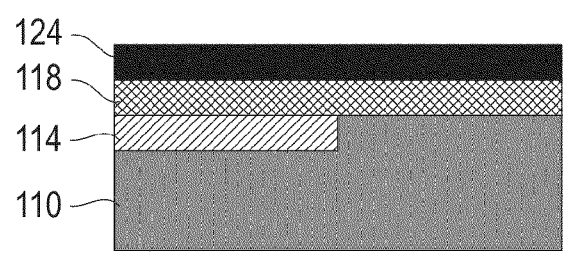

As shown in FIG. 1B, an inorganic oxide capping layer 124 is initially formed over a wide area of the high κ dielectric layer 118, and may completely cover it, as shown. The inorganic oxide may include one of a number of materials, such as an oxide formed from the metal magnesium, barium, scandium, cerium, samarium, erbium, terbium, neodymium, gallium, or lanthanum. If lanthanum oxide is used as the capping layer, any impurities are ideally reduced; in this case, the capping layer is preferably at least 50% (by weight) lanthanum oxide (i.e., predominately lanthanum oxide), more preferably at least 90% (by weight), and still more preferably at least 99 or even 99.99% (by weight). The capping layer 124 is preferably of uniform thickness, and may be formed through vacuum deposition of the selected metal oxide onto the high κ dielectric layer 118.

Figure 1C:
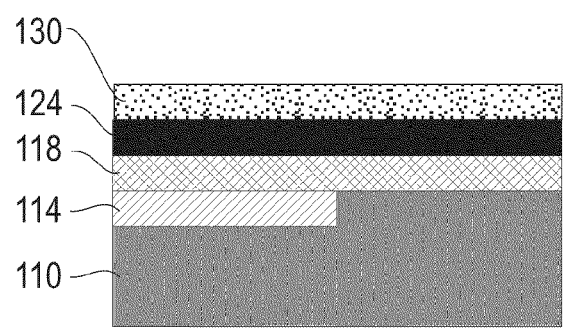

Several subsequent processing steps are designed to remove a portion of the capping layer 124, so that what remains of the capping layer is spatially aligned with the underlying semiconductor region 114. To this end, FIG. 1C shows a photoresist layer 130 that has been deposited over the capping layer 124. The photoresist may be either a positive or negative tone resist, although for the purposes of illustration it is taken here to be a positive tone resist. For example, the following positive photoresists may be suitable: EPIC™ (from Rohm and Haas, for use at 193 nm) or TARF™ (from TOK, for use at 193 nm). In any case, the photoresist may be applied over the capping layer 124 by any one of a number of techniques known to those skilled in the art, such as spin coating.

Figure 1D:
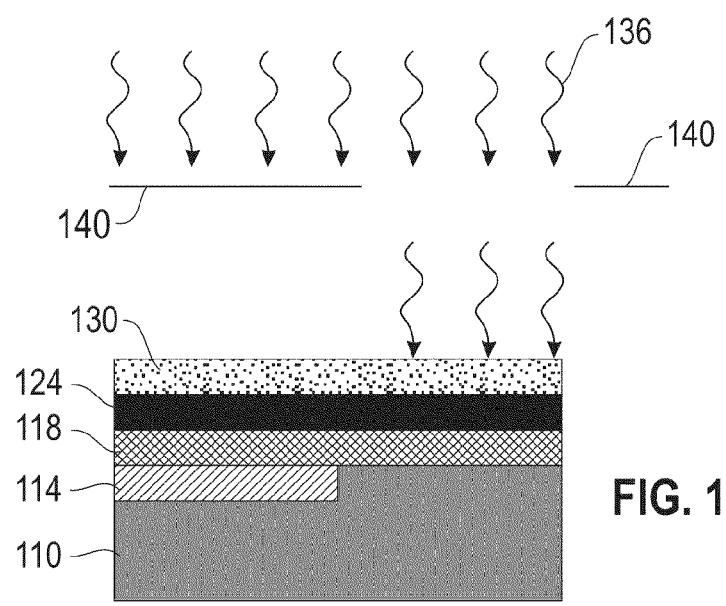

In FIG. 1D, radiation 136 is directed towards a mask having opaque portions 140 that block the radiation from reaching the photoresist layer 130, while radiation is allowed to reach those portions of the photoresist layer 130 that are not obscured by the mask. The radiation 136 may advantageously include electromagnetic radiation at 193 nm (e.g., from an ArF laser) or even at shorter wavelengths (e.g., extreme ultraviolet radiation at 13 nm). Alternatively, if e-beam radiation is used, then a mask would not be necessary. After the desired portion (or portions) of the photoresist layer 130 is exposed to radiation 136, the photoresist may be subjected to a post-expose bake.

Figure 1E:
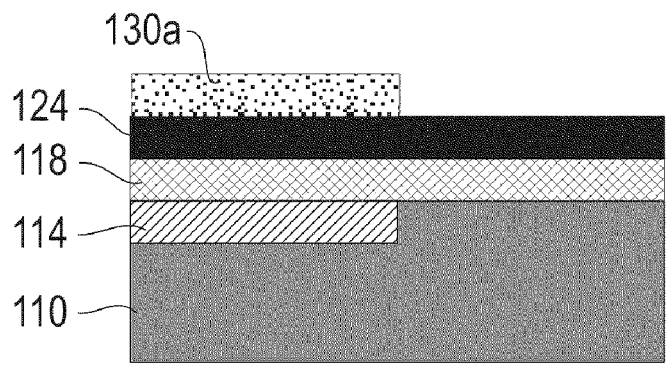

FIG. 1E shows the structure that remains following a development step. The exposed portion of the photoresist is removed as a result of this step, thereby leaving only a portion 130a of the photoresist layer 130. This photoresist layer portion 130a is ideally spatially aligned with the underlying semiconductor region 114. In the event of spatial misalignment, additional processing steps may be used, as explained below with respect to FIG. 2. The development step may involve rinsing the photoresist layer 130 (both the exposed as well as unexposed portions) with 0.26 N TMAH (tetramethylammonium hydroxide) followed by rinsing with de-ionized water (or preferably an alkaline rinse solution, as described below) to remove any developer residue, thereby revealing a portion of the capping layer 124 that had been previously covered by photoresist. Preferably, however, the capping layer 124 is rinsed with an alkaline water solution (described in greater detail below with respect to FIGS. 4, 5, and 6) to remove any developer residue. The result of using the alkaline water solution is that a thickness of less than 1 angstrom of the capping layer 124 is dissolved away in the process (e.g., the thickness of the capping layer 124 that is dissolved away is less than 1 angstrom over the entire extent of that portion of the capping layer that comes into contact with the alkaline water solution, or alternatively, the average thickness of that portion of the capping layer contacted by the rinse solution is reduced by less than 1 angstrom)—this is particularly important in the event that the portion 130a of the photoresist layer is not properly spatially aligned with the semiconducting region 114. In another preferred embodiment, less than 50% of the mass of that portion of the capping layer 124 underlying the rinse solution is dissolved away by this rinsing step.

Figure 1F:
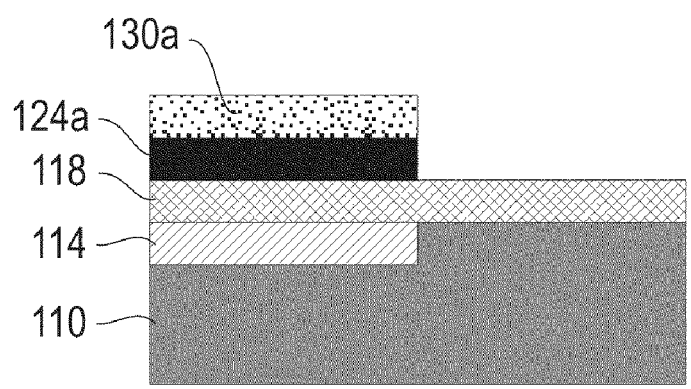
Figure 1G:
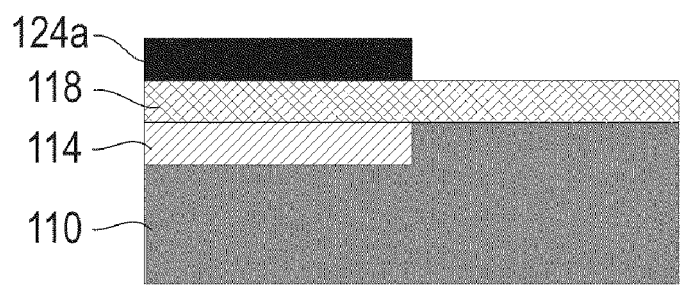

As shown in FIG. 1F, an etch step is employed to remove that portion of the capping layer 124 that is not covered by the portion 130a of the photoresist layer. This step may be a wet etch involving aqueous acid, for example. As shown in FIG. 1G, the photoresist portion 130a is then removed by a solvent strip etch, thereby revealing a portion 124a of the underlying capping layer 124 that had been previously covered by the photoresist portion 130a. At this point, the resulting structure is rinsed with an alkaline water solution (such as that described below) to remove any developer residue, which as previously mentioned dissolves away less than a 1 angstrom-thickness of the portion 124a of the capping layer. Any residue from the alkaline rinse solution is then allowed to evaporate; no follow-on rinsing of the portion 124a with any non-alkaline aqueous solution is ever required. In the structure shown in FIG. 1G, the high κ dielectric layer 118 functions as a gate dielectric for the semiconducting region 114, and the portion 124a of the capping layer modifies the properties of this gate dielectric. In one embodiment, for example, the semiconducting region 114, the high κ dielectric layer 118, and the portion 124a of the capping layer form a semiconducting element (or at least a portion thereof), such as a field effect transistor (FET). The structure shown in FIG. 1G may form part of a larger structure, e.g., it may be interconnected with other (similar or dissimilar) structures formed using the methodology described herein.

Figure 2:
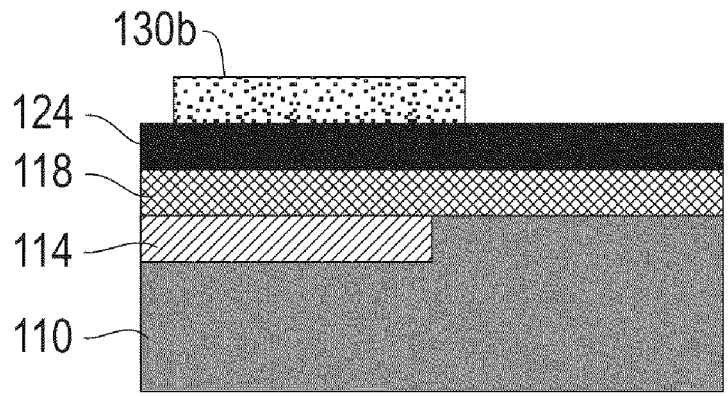
FIG. 2 illustrates an intermediate structure of the present invention, in which photoresist is spatially misaligned with an underlying semiconducting region, leading to stripping of the photoresist and reapplication of another photoresist layer, without damaging the metal oxide capping layer.

As mentioned previously in connection with FIG. 1E, the portion 130a of the photoresist layer is ideally aligned with the semiconducting region 114. In practice, however, there may be some spatial misalignment between them, which then needs to be addressed. This situation is illustrated in FIG. 2, in which a portion 130b of the photoresist layer 130 is left behind as a result of misalignment of the mask prior to irradiating the photoresist layer. (By way of contrast, correct positioning of the mask is shown in FIG. 1D.) Note that this portion 130b is not spatially aligned with the underlying semiconducting region 114. Because the misalignment shown in FIG. 2 can arise, it is recommended to verify that the proper spatial alignment between the remaining photoresist and the semiconducting region has been obtained before proceeding to the next processing steps. For this reason, after the structure shown in FIG. 1E has been constructed, it is advantageous to determine the position of the remaining photoresist and compare it with the position of the underlying semiconducting region, which may be accomplished with the aid of fiducial marks (not shown). These marks are usually located in a region of the substrate that does not contain electronic elements, e.g., in the kerf between two integrated circuits.

If the positions of the remaining photoresist and the underlying semiconducting region 114 differ by more than a preselected amount (e.g., if the mismatch exceeds 20% of the smallest feature's critical dimension), further lithographic processing is warranted. Likewise, further processing is warranted when the photoresist has been incorrectly treated or determined to contain imperfections. In particular, if one of these situations arises, the photoresist portion 130b is stripped away, and another (second) layer of photoresist is applied over the capping layer 124 (see FIG. 1C). The method then continues as described previously in connection with FIG. 1. In particular, this second layer of photoresist is exposed to radiation (see FIG. 1D), thereby forming an exposed portion of the second layer of photoresist, which may then be post-exposure baked. The photoresist layer is then developed, thereby revealing a portion of the capping layer 124, while leaving behind the photoresist portion 130a that is aligned with the semiconducting region 114 (see FIG. 1E). Additional processing as described in connection with FIG. 1 leads to the structure shown in FIG. 1G. (Note, however, that repeated cycles may be required to achieve an acceptable degree of alignment between the photoresist portion 130a and the semiconducting region 114.)

Figure 3A:
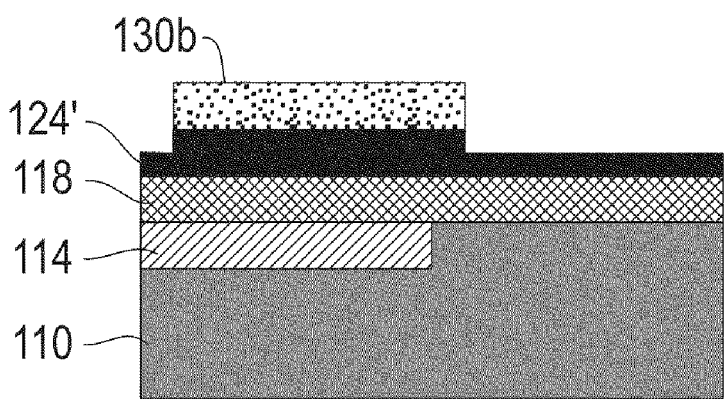
FIGS. 3A and 3B, illustrates how defects would be introduced into a semiconducting device if the alkaline rinse agents of the present invention were not employed.
Figure 3B:
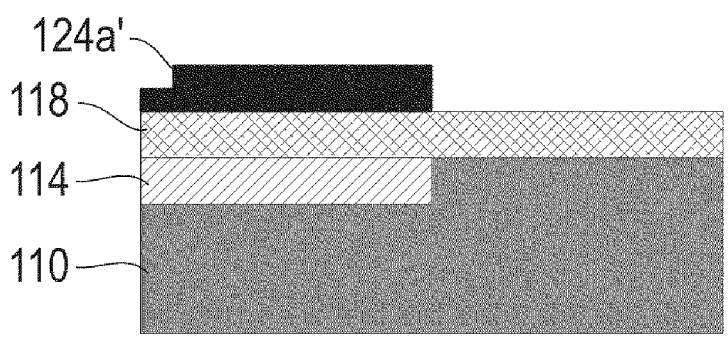

The advantage of using an alkaline rinse that does not dissolve away any significant thickness of the capping layer 124 is evident when considering FIG. 3A, which shows the structure that would result from rinsing the structure of FIG. 2 with traditional rinse agents. The resulting capping layer 124' shown in FIG. 3A is of a non-uniform thickness, since a portion of the capping layer 124 was protected by the photoresist portion 130b. Subsequent processing leads to the end product shown in FIG. 3B, which shows a metal oxide capping portion 124a' that is spatially aligned with the underlying semiconductor region 114, but unfortunately is of non-uniform thickness. In particular, the non-uniform thickness evident on the left hand side of the capping portion 124a' may be regarded as a defect, which would lead to sub-standard device performance.

Alkaline Rinse Agents

The alkaline rinse agents used to treat the metal oxide capping layers described herein should be carefully selected, since as discussed below, not all alkaline aqueous solutions lead to the formation of suitable structures. Of particular importance is whether the alkaline solution leads to unacceptable thinning of the capping layer or results in the formation of defects within the capping layer.

Figure 4:
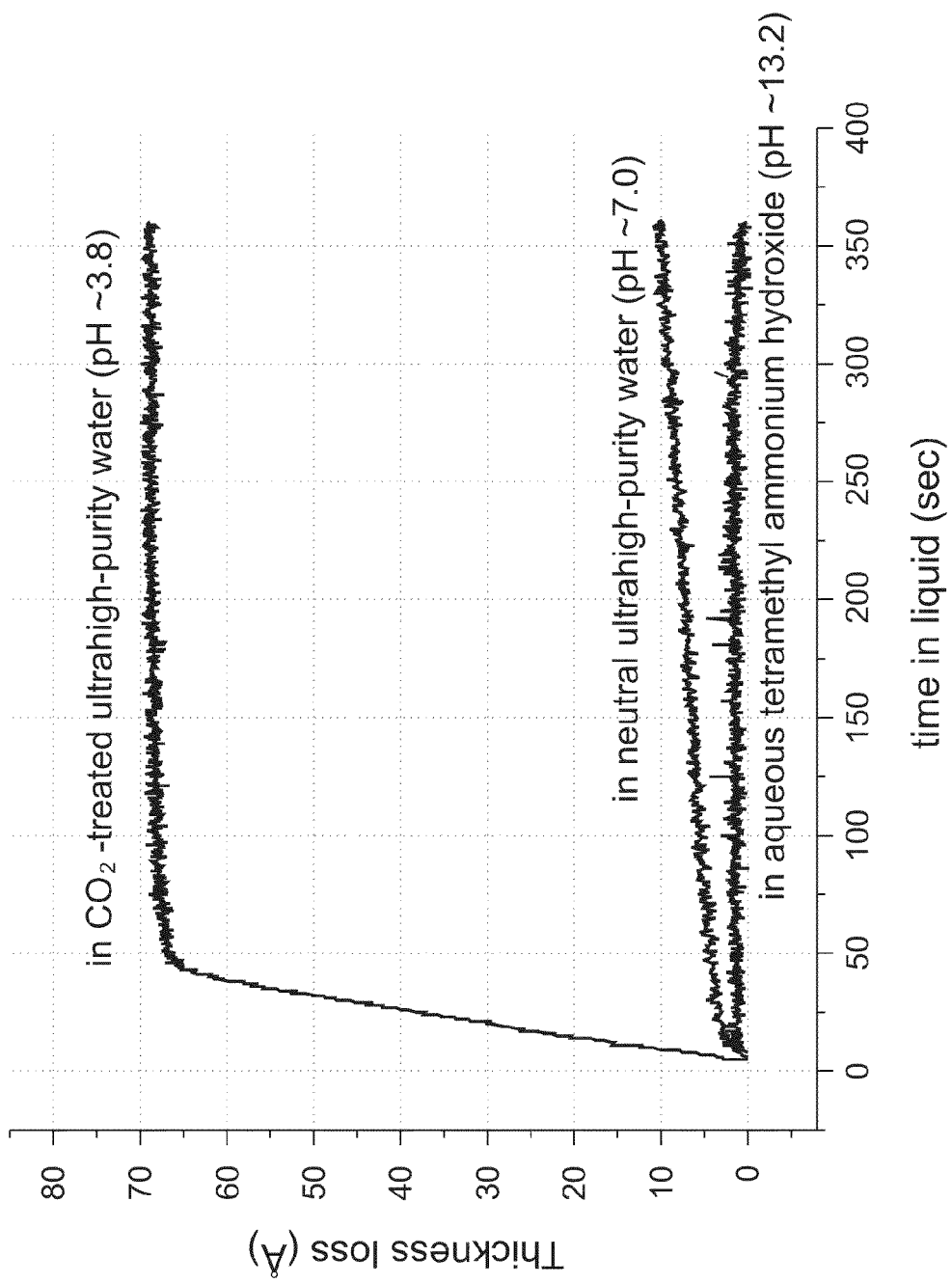
FIGS. 4, 5, and 6 present experimental data related to the present invention, illustrating the beneficial aspects of the alkaline rinse agents disclosed herein.

The effect of process chemicals on capping layer thinning can be measured dynamically using an optical reflectance spectrometer. A description of the spectrometer and the method for determining thin film dissolution rates may be found in, for example, "Characterization of Reactive Dissolution and Swelling of Polymer Films Using a Quartz Crystal Microbalance and Visible and Infrared Reflectance Spectroscopy", W. Hinsberg et al., Macromolecules, vol. 38, 1882-1898 (2005). FIG. 4 shows the results of such a measurement of the thinning of an approximately 70 angstrom thick layer of lanthanum oxide, a typical capping material. This graph plots film thickness loss as a function of time of contact with three liquids: aqueous TMAH (typically used as the photoresist developer), ultrahigh purity (UHP) water pretreated with carbon dioxide, and neutral, degassed UHP water. The metal oxide is not significantly thinned by the TMAH developer solution, but it is thinned when contacted with either ultrahigh purity (UHP) water pretreated with carbon dioxide or neutral, degassed UHP water. The rate of thinning is very high in the carbon dioxide treated water. While the rate of thinning is less in neutral, degassed UHP water, it is still high enough to cause defects in the metal oxide. Moreover, in degassed water, the electrical conductivity of the liquid is very low, so that there is increased risk of electrostatic damage.

Nevertheless, TMAH is not acceptable as a rinse agent either, since particulate defects in the metal oxide are formed if the TMAH is allowed to remain in contact with the metal oxide or simply allowed to evaporate without being rinsed away (due to the nonvolatile residue from the TMAH). Thus, in practice, the TMAH developer solution must be rinsed away after the photoresist pattern has been developed.

Figure 5:
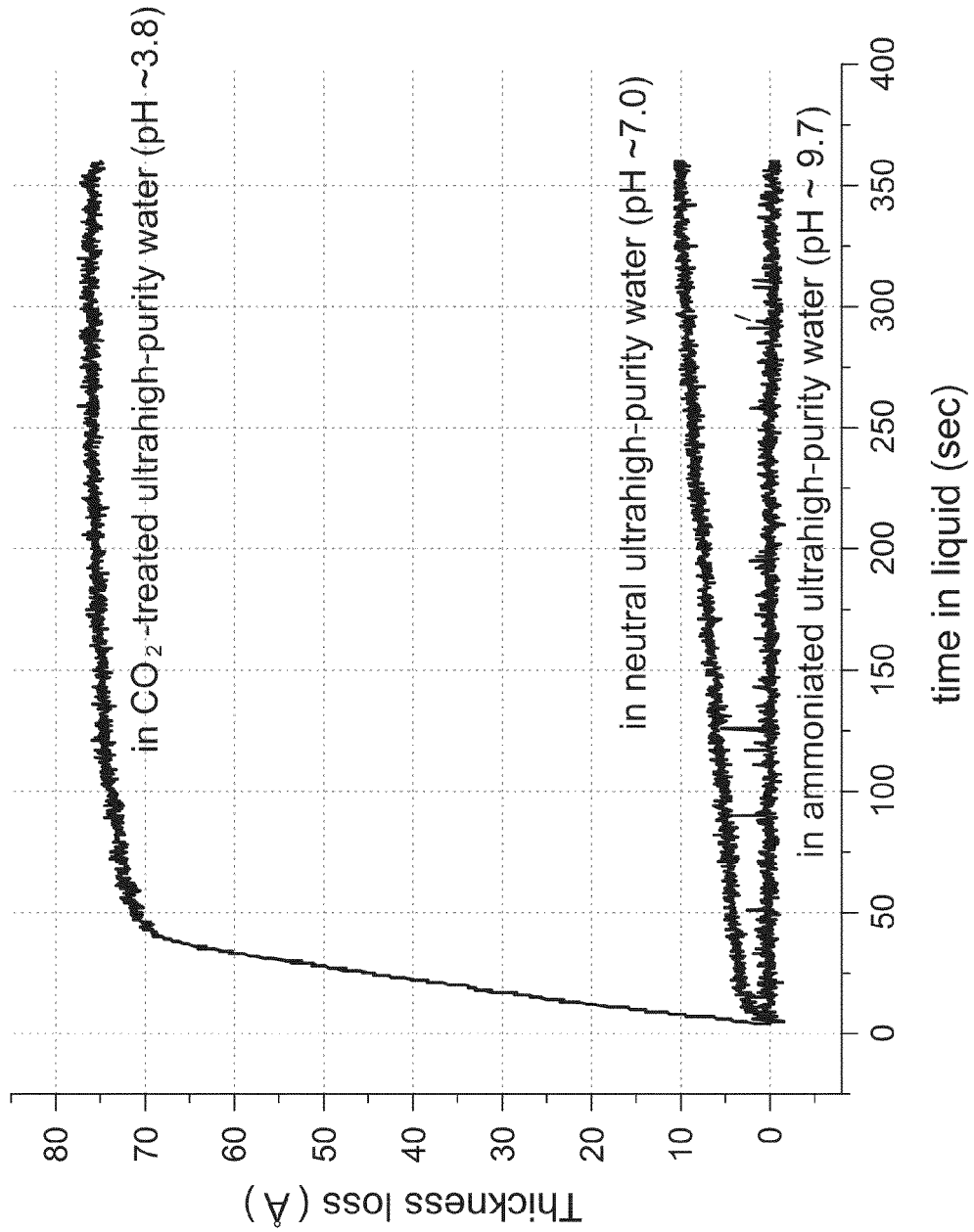

On the other hand, suitable choices for rinse agents include ammonia, a volatile amine, or another volatile basic compound dissolved in purified water. By way of example, a solution of ammonia in water at a concentration of $2 \times 10^{-2}$ molar was prepared, and the rate of thinning of a lanthanum oxide thin film in contact with this solution was determined using an optical reflectance spectrometer as described above. This was compared to the rates of thinning caused by ultrahigh purity (UHP) water pretreated with carbon dioxide, as well as neutral, degassed UHP water. The results of these measurements are shown in FIG. 5. In the case of the ammoniated water, the rate of thinning is negligible.

Ammonia is a basic compound and as such undergoes reaction with water to form ionic species:

$$NH_3 + H_2O \leftrightarrows NH_4^+ + OH^-$$

(See, for example, "Fundamentals of Analytical Chemistry," Second Edition, D. A. Skoog and D. M. West, Holt, Rinehart and Winston, New York, 1969, p 252.) These ionic species impart electrolytic conductivity to the mixture, rendering the fluid able to carry an electrical current and thereby acting to mitigate electrostatic damage. Using the limiting equivalent conductances of the ions, the electrical conductance of a solution, a measure of its capacity to dissipate charge, can be calculated (see Skoog et al., supra, and "Instrumental Methods of Analysis," Fifth Edition, H. H. Willard, L. L. Merritt, Jr. and J. A. Dean, D. Van Nostrand Company, New York, 1974, Chapter 26). For a solution of $2 \times 10^{-2}$ molar ammonia in water, the calculated conductance of this solution is $14 \times 10^{-6}$ S/cm, orders of magnitude greater than the conductivity of neutral UHP water ($0.04 \times 10^{-6}$ S/cm), and comparable to the conductivity of pH 5 carbon dioxide treated water of $4 \times 10^{-6}$ S/cm that is commonly used as a rinse liquid. The ammonia solution therefore offers protection against electrostatic damage equivalent to carbon dioxide treated water.

The ammonia concentration required to adequately suppress thinning of the metal oxide capping layer was determined as follows. UHP water was allowed to stand in contact with ambient atmosphere, under which condition water absorbs atmospheric carbon dioxide to reach an equilibrium concentration. The pH of this water after equilibration was 5.2. A series of solutions of ammonia in this water were prepared using concentrated ammonium hydroxide (29.2 wt. % ammonia by assay) followed by repeated serial dilutions with UHP water. The thinning of a thin lanthanum oxide film in this series of dilutions was determined using the optical reflectance spectrometer method described above.

Figure 6:
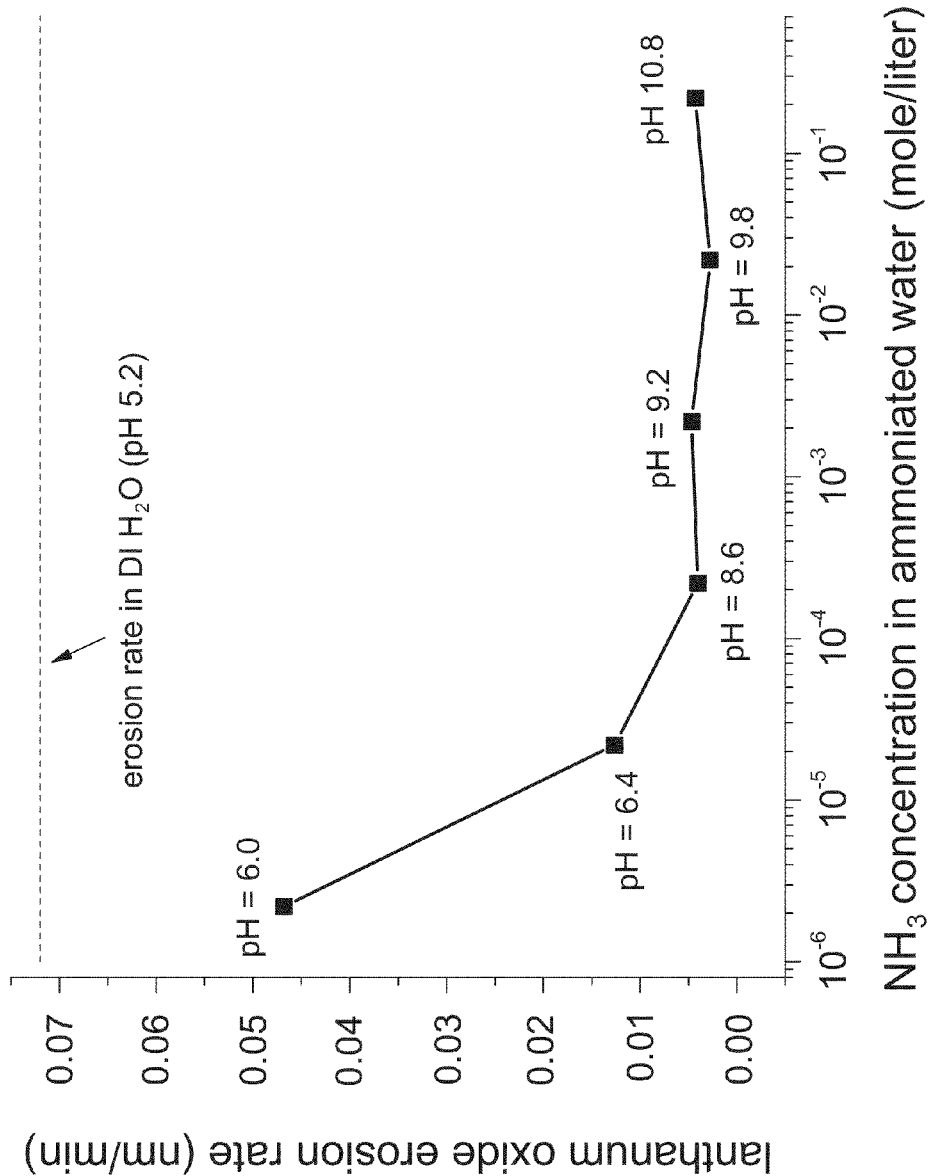

The results are displayed in FIG. 6 and are plotted as rates of thinning versus ammonia concentration. These results demonstrate that only a dilute ammonia solution is required to achieve the beneficial effect on suppressing thinning of the capping layer. Dilute solutions of ammonia are only weakly basic; for example, the $2\times10^{-2}$ molar ammonia in water has a measured pH of 9.8. This is well below the pH of the TMAH solutions typically used to develop photoresist patterns (e.g., pH of 13.2 for 0.26 Molar TMAH). Such a dilute ammonia solution is too weakly basic to dissolve photoresists in common use and is therefore suitable for use as the rinse agent. Moreover, since ammonia is volatile (namely, a gas at room temperature), there is no residue that remains after the rinse solution is allowed to evaporate. As suggested by FIG. 6, ammoniated water solutions having a pH in the range of 8.6 to 14 are preferred rinse agents. A $NH_3$ concentration between 1 and $10^{-4}$ molar is preferred.

Thus, ammoniated water is a useful and acceptable liquid rinse mixture for use with metal oxide layers formed during lithographic processing. In particular, ammoniated water can be used to rinse away the developer solution without appreciably thinning the metal oxide capping layer, while providing sufficient conductivity to mitigate electrostatic damage. Moreover, it does not contain nonvolatile solutes that would cause defects in the metal oxide following evaporation of the rinse liquid.

The ammoniated rinse solution can be premixed and supplied from bulk containers to the wet process equipment instead of deionized water (as in the prior art). Alternatively, an incoming deionized water stream can be mixed with ammonia gas or with concentrated ammonia solution prior to dispensing during the rinsing process.

Other rinse agents are suitable so long as they are alkaline, provide suitable conductivity and do not leave a residue following the final rinse. For example, surface tension modifying agents that suppress line collapse (e.g., a co-solvent alcohol) may be included in the alkaline rinse solution without disrupting the benefits described here. Other volatile basic compounds, for example, small chain or low molecular weight amines, can also serve the same function as ammonia.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method of treating a metal oxide film of a metal gate device, the method comprising:
    following at least one process step to form the film, rinsing at least a portion of the film with alkaline water (having a basic compound therein) to remove residue, while dissolving a limited amount of said portion of the film such that the average thickness of said portion of the film is reduced by less than 1 angstrom, and wherein following the rinsing step:
    i) the alkaline water, including its basic compound, evaporates, thereby leaving no residue, wherein the alkaline water does not include nonvolatile solutes, and
    ii) said portion of the film is not rinsed in a non-alkaline aqueous solution, wherein the metal oxide includes an oxide selected from the group consisting of magnesium, barium, scandium, cerium, samarium, erbium, terbium, neodymium, lanthanum, and gallium oxides.

2. The method of claim 1, wherein the metal oxide is predominately lanthanum oxide.

3. The method of claim 2, wherein the pH of the water is greater than 8.6.

4. The method of claim 2, wherein the pH of the water is in the range of 8.6 to 14.

5. The method of claim 2, wherein said at least one process step includes a photoresist process.

6. The method of claim 2, wherein the alkaline water includes $NH_3$.

7. The method of claim 6, wherein the $NH_3$ concentration is between 1 and $10^{-4}$ molar.

8. The method of claim 2, wherein the alkaline water includes volatile amines.

9. The method of claim 2, wherein the alkaline water includes surface tension modifying agents.

10. The method of claim 2, wherein the pH of the water is in the range of 8.6 to 14, and said at least one process step includes a photoresist process.

11. The method of claim 10, wherein the alkaline water includes $NH_3$.

12. The method of claim 11, wherein the alkaline water includes surface tension modifying agents.

13. A method of treating a metal oxide film of a metal gate device, the method comprising:
    following at least one process step to form the film, rinsing at least a portion of the film with alkaline water (having a basic compound therein) to remove residue, while dissolving less than 50% of the mass of said portion of the film, and wherein following the rinsing step:
    i) the alkaline water, including its basic compound, evaporates, thereby leaving no residue, wherein the alkaline water does not include nonvolatile solutes, and
    ii) said portion of the film is not rinsed in a non-alkaline aqueous solution, wherein the metal oxide includes an oxide selected from the group consisting of magnesium, barium, scandium, cerium, samarium, erbium, terbium, neodymium, lanthanum, and gallium oxides.

14. The method of claim 13, wherein the metal oxide is predominately lanthanum oxide.

15. The method of claim 14, wherein the alkaline water includes $NH_3$.

16. The method of claim 15, wherein the $NH_3$ concentration is between 1 and $10^{-4}$ molar.

17. The method of claim 14, wherein the alkaline water includes volatile amines.

18. The method of claim 14, wherein the alkaline water includes surface tension modifying agents.

19. The method of claim 14, wherein the pH of the water is in the range of 8.6 to 14, and said at least one process step includes a photoresist process.

20. A method, comprising:
    (a) forming at least one semiconducting region that resides over a substrate;
    (b) forming a dielectric region on said at least one semiconducting region;
    (c) forming an inorganic capping layer on the dielectric region;
    (d) applying a photoresist layer over the capping layer;
    (e) exposing a portion of the photoresist layer to radiation to form an exposed photoresist layer;

(f) optionally applying a post-exposure bake to the exposed photoresist layer;
(g) developing the exposed photoresist layer to remove a portion of it, thereby revealing a first portion of the capping layer;
(h) rinsing the developed photoresist layer and the first portion of the capping layer with alkaline water (having a basic compound therein) to remove any residue, while dissolving a limited amount of the first portion of the capping layer such that the average thickness of the first portion of the capping layer is reduced by less than 1 angstrom;
(i) etching away the first portion of the capping layer;
(j) applying a strip etch to remove remaining photoresist, thereby revealing a second portion of the capping layer that had been in contact with photoresist; and
(k) rinsing the second portion of the capping layer with alkaline water (having a basic compound therein) to remove any residue, while dissolving a limited amount of the second portion of the capping layer such that the average thickness of the second portion of the capping layer is reduced by less than 1 angstrom;
and wherein following the rinsing of step (k):
(1) the alkaline water, including its basic compound, evaporates, thereby leaving no residue, wherein the alkaline water does not include nonvolatile solutes, is and (m) the second portion of the capping layer is not rinsed in a non-alkaline aqueous solution.

21. The method of claim 20, wherein the capping layer is predominately lanthanum oxide.

22. The method of claim 21, wherein said at least one semiconducting region, the dielectric region, and the second portion of the capping layer form at least part of a semiconducting element.

23. The method of claim 22, wherein the semiconducting element includes a field effect transistor.

24. The method of claim 22, comprising repeating the method of claim 21 to form additional semiconducting elements that are in electrical communication with each other, thereby forming a semiconducting device.

25. The method of claim 22, wherein the radiation includes 193 nm radiation.

26. The method of claim 22, wherein the dielectric region includes hafnium oxide.

27. The method of claim 21, wherein prior to step (d), a developed portion of a photoresist layer is stripped if the developed portion is misaligned with the semiconducting region.

\* \* \* \* \*